United States Patent [19]

Chang

[11] Patent Number: 4,483,725
[45] Date of Patent: Nov. 20, 1984

[54] REACTIVE VAPOR DEPOSITION OF MULTICONSTITUENT MATERIAL

[75] Inventor: Robert P. H. Chang, Warren, N.J.

[73] Assignee: AT&T Bell Laboratories, Murray Hill, N.J.

[21] Appl. No.: 429,289

[22] Filed: Sep. 30, 1982

[51] Int. Cl.³ .............................................. C23C 11/08
[52] U.S. Cl. .................................... 148/175; 148/174; 204/192 S
[58] Field of Search .............................. 148/175, 174; 204/192 R, 192 S; 29/576 E, 576 B

[56] References Cited

U.S. PATENT DOCUMENTS 3,916,034 10/1975 Tsuchimoto ......................... 148/175
4,086,108 4/1978 Gonda ................................. 148/175
4,217,374 8/1980 Ovshinsky et al. ............... 204/192 S

FOREIGN PATENT DOCUMENTS 2076587 12/1981 United Kingdom .

OTHER PUBLICATIONS

Bean, "Silicon Molecular Beam Epitaxy as a VLSI Processing Technique", *Proceedings of the International Electron Devices Meeting*, 12/81, pp. 1.2–6.13.
Bunshah–*Thin Solid Films*, vol. 80, pp. 255–261, (1981).
Meiners, *Journal of Vacuum Science and Technology*, vol. 21(2), pp. 655–658, 3/82.
Aspnes, *Optical Properties of Solids:New Developments*, Chap. 15; 1976.

*Primary Examiner*—L. Dewayne Rutledge
*Assistant Examiner*—S. Kastler
*Attorney, Agent, or Firm*—Eugen E. Pacher

[57] ABSTRACT

The low temperature method for depositing multiconstituent material on a substrate uses at least two ballistic particle streams that are caused to intersect in a volume of space proximate to the substrate. One particle stream, the "gas" stream, comprises excited neutral particles, and the other particle stream, the "metal" stream, consists substantially of a particle species capable of chemically reacting with the excited neutrals. The excited neutrals are typically produced in a RF-generated plasma or by means of photon excitation, the source of the metal stream is typically an evaporator or a Knudsen cell. Charged particles can be removed from the gas stream by means of magnetic and/or electric fields, and their removal typically advantageously affects the electrical properties of the deposits. The method has broad applicability, and can be used, for instance, to deposit high quality stoichiometric oxide or nitride films on silicon, germanium, III–V or II–VI semiconductors, metals, or insulators, as well as to deposit doped or layered multiconstituent films. Because deposition can take place at very low substrate temperatures, generally between about 30° C. and 250° C., a patterned deposit can be produced by deposition onto a resist-masked substrate, followed by, removal of the resist by, e.g., lift-off.

33 Claims, 11 Drawing Figures

REACTIVE VAPOR DEPOSITION OF MULTICONSTITUENT MATERIAL

FIELD OF THE INVENTION

This invention pertains to the field of deposition of multiconstituent material on a substrate.

BACKGROUND OF THE INVENTION

Thin multiconstituent films can be found in a great variety of technological products, from optical lenses to integrated circuits, and a plethora of methods for producing such films exist. Since this application is concerned with a deposition method carried out in a vacuum environment, my discussion will be confined to such vacuum methods.

Among the vacuum deposition methods those carried out at low temperatures are of increasing importance in, inter alia, the semiconductor industry. For instance, in silicon very large scale integration (VLSI) technology, it is desirable to maintain processing temperatures below about 600° C. to avoid substrate warpage, dopant diffusion, and other yield- or device characteristic-affecting problems. Similarly, in the compound semiconductor device field (e.g., GaAs devices), low processing temperatures are required, due to the low surface incongruent evaporation temperatures and the high chemical reactivity of these materials. In general, it can be said that low temperature operability is a very important characteristic of a material deposition process for use in the semiconductor industry or in industries using similar technologies.

However, many of the standard prior art methods for forming thin films of multiconstituent materials on a substrate typically require relatively high processing temperatures. Methods in this category are thermal oxidation or nitridation of silicon, which produce $SiO_2$ and $Si_3N_4$ by consuming substrate material in the presence of oxygen or nitrogen, respectively, and chemical vapor deposition (CVD), which produces multiconstituent material by means of thermally induced reactions among appropriate gaseous reactants in contact with a substrate surface.

Among prior art deposition methods that can be practiced at relatively low substrate temperature is sputtering (including reactive sputtering), evaporation (including activated reactive evaporation), plasma deposition, plasma assisted CVD, molecular beam deposition, and ion beam deposition. Some of these techniques will now be briefly reviewed.

The "activated reactive evaporation process", a plasma-enhanced deposition process, uses metal or alloy vapors from an evaporation source together with a gas that is capable of chemically reacting with the vapor and that is injected into a reaction region inside a vacuum chamber. The reaction between vapor and gas atoms may be encouraged to go to completion by activating and/or ionizing both the metal and gas atoms in the vapor phase. This is typically accomplished through acceleration of secondary electrons formed in a thin plasma sheet above the metal vapor source, acceleration typically being by means of an electrode placed between deposition substrate and evaporator. The thus accelerated electrons create a plasma-filled region between the electrode and the evaporator in which the metal and gas atoms are ionized or activated, leading to an increased probability of reaction between the two species. See, for instance, R. R. Bunshah, *Thin Solid Films,* Vol. 80, pp. 255-261, (1981). Because of the proximity of the plasma region to the substrate and of the presence of relatively energetic electrons, the method typically subjects the substrate to ion and/or electron bombardment.

Another prior art method is plasma deposition as exemplified by Pat. G.B. No. 2,076,587A, issued to Nippon Telegraph and Telephone Public Corporation, for "Plasma Deposition Apparatus", published Dec. 2, 1981. The patent discloses apparatus having a separate plasma formation chamber and specimen chamber, with a plasma stream passing through the plasma extracting orifice of the plasma formation chamber into the specimen chamber, where the stream is accelerated by the effect of a divergent magnetic field. In the plasma chamber, gases introduced therein are activated and/or ionized by microwaves. The thus activated accelerated particles impinge on the substrate and react thereon to form a deposit film. All chemical constituents of the film are present in the plasma chamber and are extracted therefrom. For instance, in order to form a silicon nitride film, both silane gas ($SiH_4$) and ammonia gas ($NH_3$) are introduced into the plasma chamber.

It will be noted that the above discussed low temperature deposition methods use plasma-created ionized or excited species to drive the desired reaction. It is a common feature of low temperature methods that energy is supplied to the reaction region by nonthermal means, typically through the presence therein of an excited or ionized particle species.

In addition to operability at low temperature there are several other desirable characteristics of a multiconstituent material deposition process useful in semiconductor device processing and similar applications. For instance, it is desirable, and will probablay become increasingly more important in VLSI device manufacture, that such a process does not cause any substantial substrate damage, i.e., cause unwanted modifications of the substrate surface and/or adjacent substrate material, since such damage can adversely affect device characteristics. Such damage can, for instance, be caused by bombardment with relatively energetic charged particles. Several prior art processes typically do expose the substrate to such particles. These processes include deposition in a neutral or ionized gaseous medium, plasma deposition, and the activated reactive evaporation process.

A further relevant process characteristic is its contamination susceptibility. In particular, a process in which particles, produced by the interaction of the reactive medium, e.g., plasma, with a foreign substance, e.g., a reactor wall, have free access to the deposition region, is typically more likely to produce contaminated deposits than is a process in which such access is restricted or eliminated.

The final process characteristic I wish to mention is the control of deposit stoichiometry afforded by a multiconstituent material deposition process. Some prior art processes either permit only limited control of deposit compostion (e.g., CVD), are difficult to control due to the process' sensitivity to some processing parameter (e.g., molecular beam depostion's typical sensitivity to source temperature), or inherently tend to produce nonstoichiometric deposits.

Prior art methods for depositing multiconstituent material on a substrate that are applicable to semiconductor device manufacture and to similar technologies typically do not possess all of the above discussed desirable characteristics. Although at least some of these methods perform adequately at current levels of silicon integrated device technology, it is expected that further device miniaturization and improvements in device characteristics may require improvements with regard to these deposition process characteristics. A process that can form high quality multiconstituent material at very low substrate temperature, that can be practiced such as not to cause any significant substrate damage and to be essentially contamination free, and that allows close and relatively easy control of deposit stoichiometry thus is of substantial technological interest.

DEFINITIONS

A "multiconstituent" material herein is material of general chemical formula $A_xB_yC_z$..., with at least x and y not being equal to zero, and with the subscripts not necessarily being integers.

A "particle stream" herein is a flux of particles having an average direction of motion, and having limited lateral dimensions. This implies that the particle trajectories are substantially ballistic, i.e., not diffusive.

By "ballistic" particle motion, I mean motion such that the (average) particle mean free path is of macroscopic length, typically at least about a centimeter.

An "elemental" particle stream herein is considered to consist essentially of particles of one chemical element. The particles may include atoms (excited or unexcited), ions, molecules (excited or unexcited), and small atomic clusters.

By "excited neutral particles", I mean atoms or molecules that are in an excited electronic state, the lifetime of the excited state typically being at least of the order of the particles's time of flight from the particle source to the substrate.

A quantity is herein considered to be "of the order of" another quantity if the magnitudes of the two quantities differ by no more than a factor of about three.

SUMMARY OF THE INVENTION

Disclosed is a method for producing an article that comprises, at least at some time during its manufacture, multiconstituent material overlying a substrate material, with the former typically differing in chemical composition from the latter. The method comprises exposing the substrate in a deposition chamber to at least two particle streams that are caused to intersect in a volume of space proximate to the substrate, to be referred to as the "reaction region". Preferably the background pressure in the deposition chamber is such that the particle mean free path is at least of the order of the particle source-to-substrate region distance. One of the streams of particles (these particles will be referred to as "gas" particles) comprises excited neutral gas particles, their flux being a substantial fraction of the total gas particle flux in the stream, preferably at least about 10%. The other stream of particles (these particles will be referred to as "metal" particles) consists essentially of particles that are capable of undergoing a chemical reaction involving the excited neutral gas particles. In the reaction region (including, typically, the substrate surface), at least the excited neutral gas particles interact with the metal particles, resulting in formation of the multiconstituent material which deposits on the substrate.

The terms "gas particles" and "metal particles" are herein used for ease of exposition only, and this usage does not imply that the inventive method is so limited. For instance, in a typical application of the method $SiO_2$ is deposited. In this case the "metal" is silicon, a semiconductor.

In a preferred embodiment of the invention, the stream comprising excited neutral gas particles is derived from a plasma chamber that has at least one opening into the deposition chamber, and the stream of metal particles is derived from an evaporation source. In a still further preferred embodiment, the former particle stream is exposed to a magnetic field of such strength and direction as to cause removal of charged particles from the stream.

Preferred applications of the method are the deposition of multiconstituent materials, e.g., oxides, nitrides, hydrides, fluorides, or chlorides, on silicon or germanium substrates, on III—V or II—VI compound semiconductor substrates, or on metal or insulator substrates or substrate layers. Exemplary devices which can advantageously be produced by means of the inventive method are silicon integrated circuits, especially VLSI circuits, (including deposition of $SiO_2$ or $Si_3N_4$ for device isolation, or of $SiO_2$, $Si_3N_4$ or $Al_2O_3$ as an "active" dielectric in, e.g., MOS technology), compound semiconductor integrated devices, including integrated optics devices and semiconductor lasers (involving, e.g., deposition of $SiO_2$ or of other dielectric films on binary, ternary or quarternary semiconductor material), Josephson junctions and other superconducting devices (involving, e.g., deposition of NbN superconducting films, or of $Al_2O_3$ dielectric). Other exemplary device applications include deposition of compound semiconductor films (e.g., $TiO_2$), of piezoelectric films (e.g., $ZnO_2$), or of diffusion or chemical reaction barriers (e.g., TiN).

The inventive method permits deposition at low substrate temperatures, typically less than about 250° C. Furthermore, it allows convenient removal of charged particles from the gas particle stream or streams, and consequently can result in essentially damage-free deposition, since the excited neutrals typically are at thermal energies, i.e., have kinetic energies of the order of about 1/40 eV, and thus essentially do not produce any substrate damage.

The above two characteristics of the inventive process allow, inter alia, direct formation of a patterned multiconstituent deposit layer by means of deposition of the multiconstituent material onto a previously masked substrate (masked, for instance, by a resist layer), followed by later removal of the masking material (and of the multiconstituent material deposited thereon) by, e.g., a lift-off technique.

The inventive method can yield essentially contamination-free deposits since, due, inter alia, to the substantially ballistic trajectories of the particles, the particles that participate in the reaction typically interact only minimally with apparatus walls and other foreign substances. Furthermore, since at least a substantial part of the deposit results from a reaction involving the excited neutral particles, the deposition can conveniently be monitored by observation of the radiation emitted during the reaction. Such monitoring permits close control of the stoichiometry of the deposit.

DETAILED DESCRIPTION

An important aspect of the inventive method is its suitability for depositing high quality multiconstituent material onto a substrate maintained at relatively low temperatures, typically below about 250° C., and, in appropriate cases, even at about room temperature. This capability requires, inter alia, the presence of a sufficient number of excited neutral particles in the reaction region of the deposition chamber, i.e., at or close to the substrate surface onto which the material is to be deposited. The production of excited neutral particles and their delivery to the reaction region is thus a further important aspect of the invention. And a still further important aspect is the presence in the reaction region of particles that are capable of undergoing a chemical reaction involving the excited neutral particles, with at least one of the products of the reaction being the multiconstituent material to be deposited.

Figure 1:
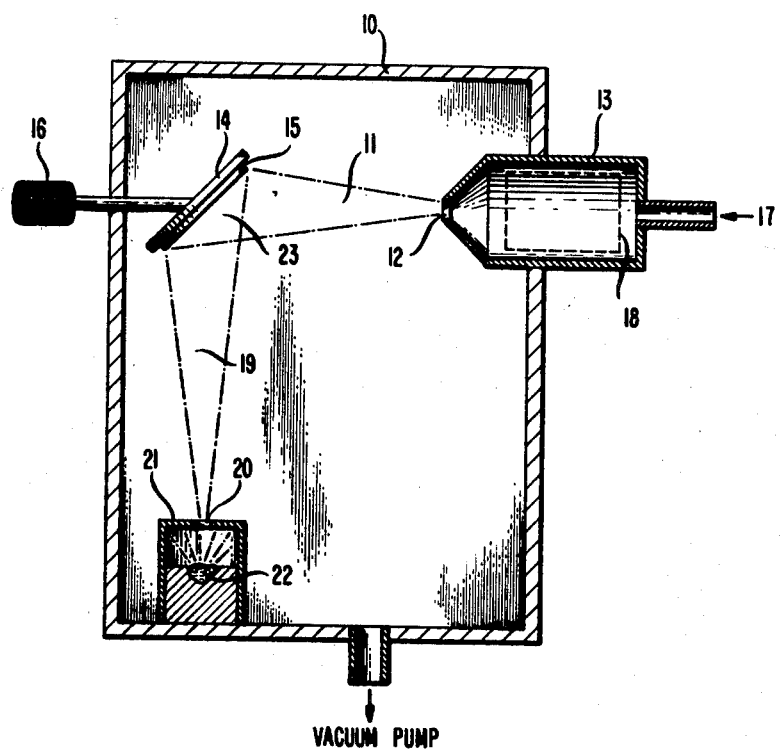
FIG. 1 schematically shows generalized apparatus for the practice of the inventive method.

The basic method is schematically depicted in FIG. 1. The process is carried out in deposition chamber 10, which forms part of a vacuum system, the details of which can be conventional and are not shown. A first (gas) particle stream 11, comprising at least a substantial fraction of excited neutral particles, issues from opening 12 in gas stream source 13 and is directed towards substrate 15, mounted on substrate holder 14, controllable by manipulating means 16. Matter is introduced into source 13, typically in form of a gas stream 17, by means well known in the art and not shown in the figure. Source 13 comprises excited particle generating means 18, which, in addition to excited neutrals, typically also generates other species of particles, e.g., ions. A second (metal) particle stream 19 issues from opening 20 in metal stream source 21. Stream 19 is also directed towards substrate 15 and intersects stream 11, thereby forming reaction region 23 in which both excited neutral gas particles and metal particles are present. Metal stream source 21 can be any particle source that is compatible with the process. In FIG. 1 I exemplify this by an evaporation source, in which volume 22 of the metal is liquified by means not shown.

Although FIG. 1, as well as the discussion herein in general, refers to two stream sources and two particle streams, it is to be understood that the method is not so limited. In particular, the method can be practiced with more than two stream sources, with more than one stream comprising excited neutrals and/or with more than one stream of particles capable of undergoing a reaction involving excited neutrals, as well as with streams arranged at other than at right angles to each other. Also, the inventive method can be combined with a variety of pre-deposition steps (e.g., for purposes of surface preparation exposing a compound semiconductor substrate to a flux of particles, e.g., atomic hydrogen, fluorine, chlorine, HF, HCl, fluorocarbons or chlorocarbons), or post-deposition steps (e.g., annealing).

Furthermore, although the discussion herein is primarily in terms of elemental particle beams, the invention is not so limited. For instance, the gas beam can be produced from a molecular gas, e.g., NH$_3$. This gas is, for instance, advantageously used in the deposition of Si$_3$N$_4$, because of the higher reactivity of the excited neutrals derived from ammonia as compared to those produced from N$_2$. Nonelemental beams can also be used advantageously if a doped depositis to be formed. This can, for instance, be done by introducing an appropriate amount of a dopant-yielding gas into the excited particle generating means, e.g., plasma generator, wherefrom the dopant particles travel to the reaction region in the gas particles stream.

An aspect of the invention is the substantially ballistic motion of the two particle streams. This means that the particles typically suffer at most a small number of collisions (typically with residual gas molecules) on their way from their respective sources to the interaction region. Because of this, the streams can be substantially laterally confined, eliminating or greatly reducing the possibility of deposit contamination by wall-derived material. In order to obtain ballistic particle motion the process needs to be carried out under vacuum conditions, typically with a background pressure in the deposition chamber less than about $10^{-4}$ Torr (about $1.3 \cdot 10^{-2}$ Pa), preferably under UHV conditions, i.e., less than about $10^{-7}$ Torr (about $1.3 \cdot 10^{-5}$ Pa).

Figure 2:
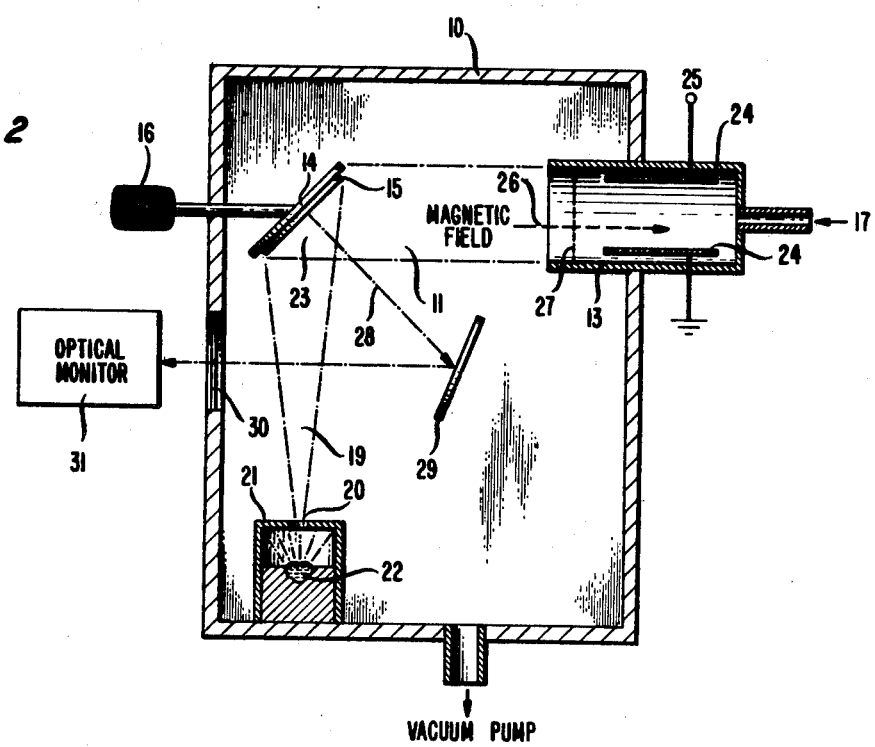
FIG. 2 depicts schematically apparatus for the practice of the inventive method that includes means for removing charged particles from the particle stream and means for deposition monitoring.

FIG. 2 schematically shows a particular generalized embodiment of apparatus for the practice of the invention. In FIGS. 1 and 2, like numerals refer to like parts. Gas particle stream source 13 comprises plasma generating means, schematically represented by two electrodes 24, one of which is shown grounded, the other having contact means 25 for connection to a source of a time-varying electrical potential, typically a RF source, not shown. Magnetic field 26, substantially parallel to the axial direction of the gas particle stream, inter alia causes charged particles having a velocity component normal to the field direction to travel in helical trajectories. Interposing conducting screen 27 in the magnetic field region between the plasma and the reaction region results in removal from the particle stream of a substantial fraction of the charged particles in the stream, since, due to their helical trajectories, a greater proportion of charged particles than uncharged particles is intercepted by the screen. Screen 27 can be electrically biased or unbiased. Similarly, substrate holder 14 (and therefore sample 15) can also be biased. In both cases such bias can reduce charged particle bombardment of the substrate. The screen position is advantageously selected according to the lifetime of the excited species employed, typically such that the screen-to-substrate time of flight is no more than about one lifetime of the excited state.

Other magnetic field configurations for reducing the number of charged particles in the gas stream are possible and will be readily apparent to those skilled in the art. For instance, since the force on a charged particle of velocity $\bar{v}$ in a magnetic field $\bar{B}$ is proportional to the vector cross product $\bar{v} \times \bar{B}$, a magnetic field substantially perpendicular to the axial direction of gas stream 11 exiting from orifice 12 in FIG. 1 can efficiently remove charged particles from the stream.

Other approaches to the formation of the beam comprising neutral excited gas particles are available and are contemplated to be within the scope of the invention. For instance, gas particles can be excited through interaction with electromagnetic radiation, e.g., laser radiation, and means for accomplishing such excitation are well known in the art. See, for instance, *Photochemistry of Small Molecules*, H. Okabe, Wiley-Interscience (1978).

FIG. 2 also depicts schematically means for monitoring the deposition process. The reaction between excited gas particles and metal particles typically results in changes in the emission of electromagnetic radiation from the interaction region. Such radiation 28, deflected by mirror 29 through window 30 into optical monitoring means 31, can, for instance, be used to adjust the intensity of beam fluxes to result in formation of deposit of the appropriate composition, as will be illustrated below. Optical monitoring means are well known to those skilled in the art and need no detailed discussion. Typically, they will comprise wavelength-selecting means, e.g., a spectrometer, and radiation detecting means, e.g., a photomultiplier tube.

The metal particle beam can be produced by any convenient means compatible with process requirements, especially the vacuum requirements. Preferred means are electron beam melting of a part of a metal sample, or vaporization in an oven with an orifice (Knudsen cell), which produces a stream of uncharged (neutral) particles. Such means are well known to those skilled in the art. See for instance, *Methods of Experimental Physics*, Vol. 14, *Vacuum Physics and Technology*, G. L. Weissler and R. W. Carlson, editors, Academic Press (1979).

Since typically the gas pressure in at least the gas particle stream source far exceeds the pressure in the deposition chamber, a differential pumping scheme is advantageously used. Such schemes, in addition to general vacuum and UHV techniques are also well known in the art (ibid).

Figure 3:
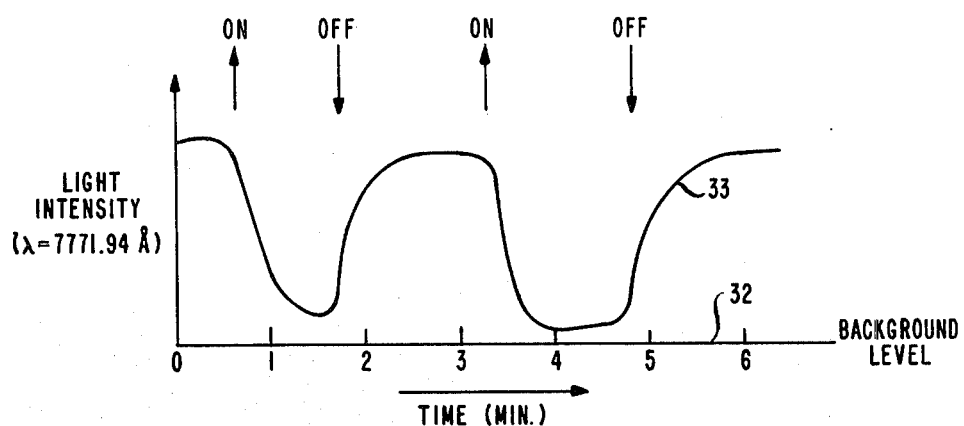
FIG. 3 shows the observed light intensity at 7771.94 Å in the reaction region as a function of time during a SiO$_2$ deposition run.

FIG. 3 shows an exemplary curve of light intensity at 7771.94 Å versus time as taken during deposition of $SiO_2$ on a Si substrate by the inventive method. The metal particle stream was produced by electron-beam melting of silicon, and the gas particle stream by permitting particles to escape from an oxygen plasma, in an arrangement similar to that shown in FIG. 2. Curve 32 is the instrumental background level. Curve 33 shows decreased detected light intensity during periods of melting of the Si sample, i.e., when Si particles were available in the reaction region for reaction with excited oxygen particles. This phenomenon can be used to adjust the particle fluxes to produce deposited material of a desired composition. For instance, a low but nonzero intensity at 7771.94 Å during $SiO_2$ deposition indicates that essentially all Si is consumed in the reaction, with a slight amount of unreacted oxygen still present. Under such conditions, the deposit is typically stoichiometric $SiO_2$.

Figure 4:
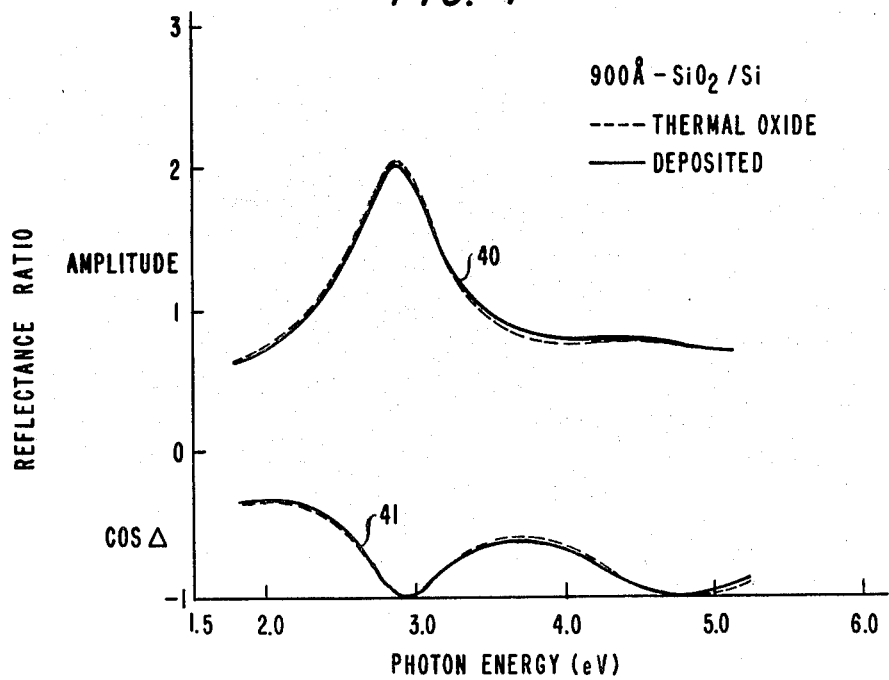
FIG. 4 shows the amplitude and the cosine of the phase $\Delta$ of the complex reflectance ratio of thermal SiO$_2$ and of SiO$_2$ grown by the inventive method.

The deposition process can also be monitored by, in situ, optically monitoring the deposit. A convenient method for doing this is spectroscopic ellipsometry. In FIG. 4, I show the ellipsometrically determined (complex) reflectance ratio of a 900 Å thick $SiO_2$ film deposited by the inventive process on Si (solid line) and, for comparison, the reflectance ratio of thermally (1100° C.) grown $SiO_2$ on Si (broken line). Curve 40 is the amplitude, and curve 41 the cosine of the phase $\Delta$ of the reflectance ratio. It is to be noted that the curves of the deposited oxide are essentially identical to those of the thermal oxide, indicating the essentially ideal stoichiometry of the deposit. Since departure of the measured dielectric function from a predetermined standard indicates a departure of the deposit from the expected composition or structure, such measurements can be used to monitor and, if necessary, adjust deposition conditions. Apparatus suitable for such monitoring is described, for instance, by D. E. Aspnes in chapter 15 of *Optical Properties of Solids: New Developments*, B. O. Seraphin, editor, North-Holland, Amsterdam 1976.

The inventive method can be used to deposit multiconstituent material on a variety of substrates, including elemental semiconductors (e.g., Si and Ge), compound semiconductors (e.g., III—V compounds such as GaAs, InP, and $Ga_{1-x}Al_xP$, and II—VI compounds such as ZnSe and $Cd_{1-x}Hg_xTe$), metals and insulators, e.g., Nb and $LiNbO_3$, respectively. It allows also formation of a wide variety of multiconstituent materials, including oxides, nitrides, fluorides, chlorides, and nitrides. Exemplary materials are $SiO_2$, $Si_3N_4$, $Al_2O_3$, $ZnO_2$, NbN, $TiO_2$, and TiN. Under appropriate conditions, the method allows also epitaxial formation of at least some materials.

Figure 5:
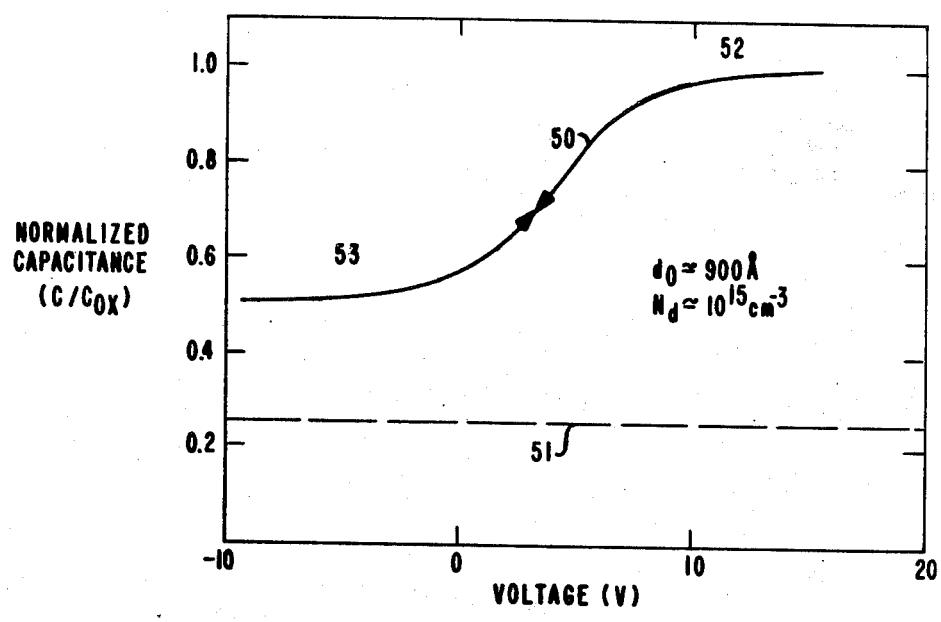
FIGS. 5 and 6 are graphs of the normalized capacitance of Si/SiO$_2$/Al sandwiches, in which the oxide layers were deposited by the inventive method.
Figure 6:
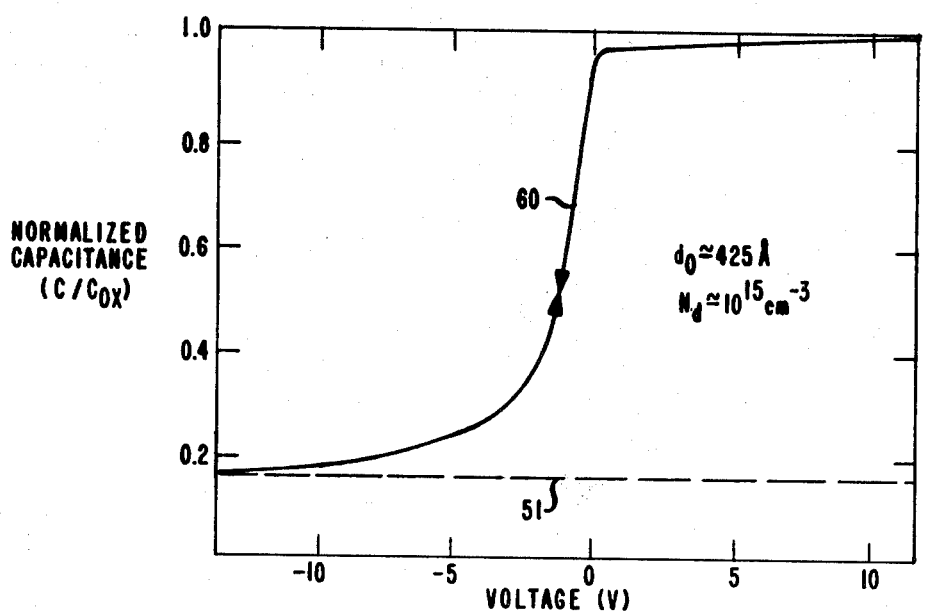

An important aspect of the invention is its suitability for deposition without significant damage to the substrate surface, either through differential matter loss from the substrate or through physical damage. Such damage can degrade device performance, e.g., in MOSFETs, and is thus of significance in, for instance, semiconductor device fabrication. A measure of film and interface quality is the standard capacitance/voltage curve of a MOS sandwich. Such results are shown in FIGS. 5 and 6, which represent experimentally determined exemplary values. In both cases the substrates were Si (n-type, $N_d = 10^{15} cm^{-3}$), with about 900 Å and 425 Å, respectively, of $SiO_2$ deposited thereon by the inventive method, without post-deposition anneal, and an Al metallization layer deposited thereon. The oxide of FIG. 5 was deposited under moderate vacuum conditions ($\sim 10^{-5}$ Torr) in apparatus similar to that depicted in FIG. 2, i.e., with the magnetic field substantially parallel to the axial direction of the oxygen stream, whereas the oxide of FIG. 6 was deposited, under similar conditions, with the magnetic field substantially perpendicular to the stream direction. The former arrangement resulted in partial removal of charged oxygen particles from the stream, and in the latter case the removal was substantially complete. Both C/V curves were measured at 1 MHz, with a 100 mV/sec bias sweep rate, and show essentially zero hysteresis, indicating a very low density of mobile charge in the oxide. However, curve 50 does not approach the theoretical minimum value (curve 51) at reverse voltage as does curve 60, and has a considerably wider transition region than the latter between the accumulation region (52) and the depletion region (53). This indicates that a substantial amount of fixed charge and a substantial number of surface states are present in the former film. The essentially complete absence of charged particles during film deposition in the latter case thus resulted in greatly improved film quality.

Figure 7:
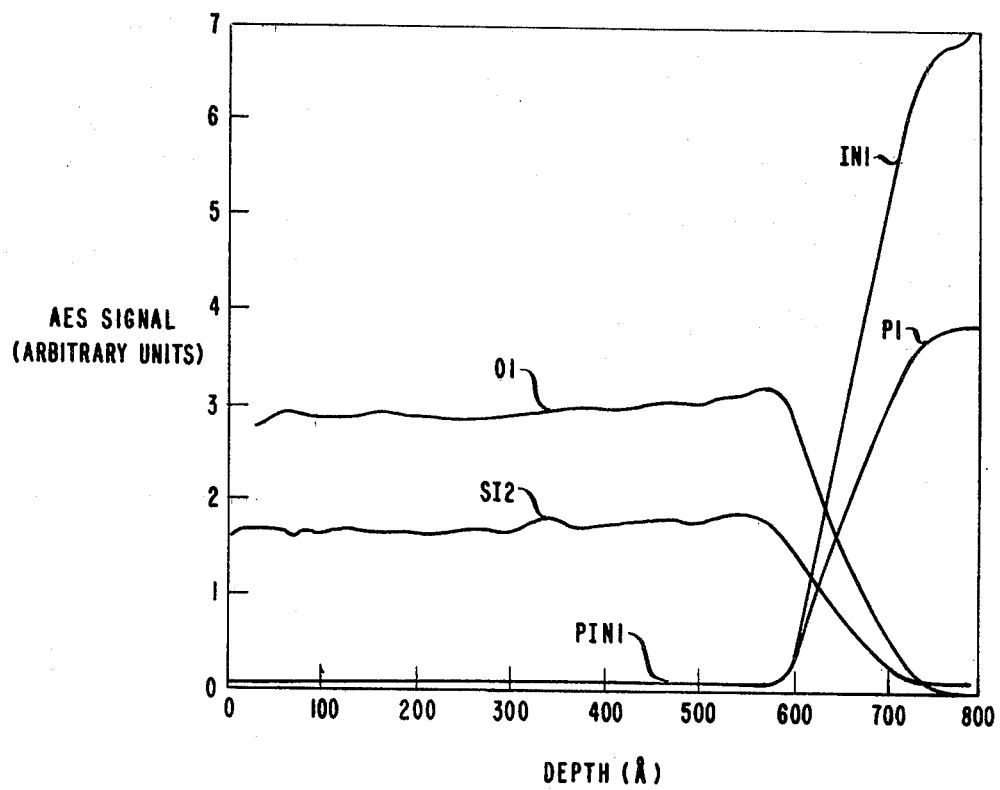
FIG. 7 shows the Auger electron spectroscopy (AES) signals observed during sputter-removing an SiO$_2$ layer on InP.

A further aspect of the invention is the relative sharpness of the resulting substrate/deposit interface. This is illustrated in FIG. 7 for a $SiO_2$ film on InP, deposited, under moderate vacuum conditions, in apparatus having a configuration similar to that shown in FIG. 2. FIG. 7 shows the AES signal as a function of depth into the sample, as obtained by a standard depth profiling technique. The following chemical species are plotted: O1—oxygen in $SiO_2$; SI2—silicon in $SiO_2$; PIN 1—InP background, IN1—In in InP; P1—P in InP. The profiles, inter alia, show that deposit stoichiometry was substantially independent of distance from the interface.

Figure 8:
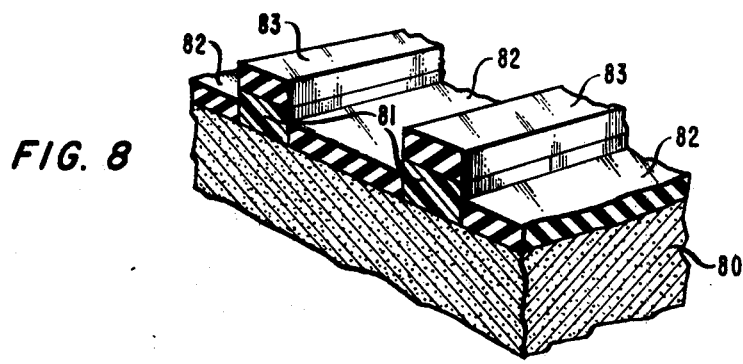
FIG. 8 schematically depicts a partially masked substrate onto which a layer of material, e.g., a dielectric, was deposited by the inventive method.
Figure 9:
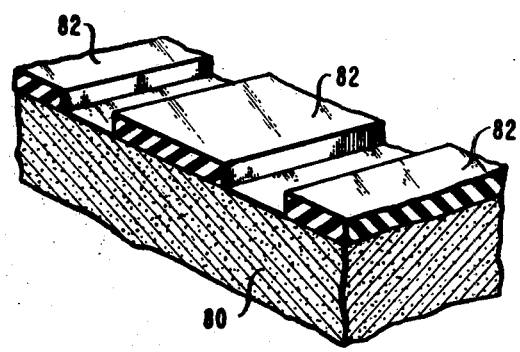
FIG. 9 schematically shows the above substrate/dielectric combination after removal of the masking layer with the dielectric thereon.

The inventive method can be used to directly form a patterned deposit layer, i.e., without masking of the deposit layer and removing of the unmasked deposit material. For instance, a patterned mask, e.g., an organic resist mask, can be created on the substrate layer by conventional lithography techniques prior to deposition thereon, by the inventive method, of multiconstituent material. The post-deposition situation is schematically illustrated in FIG. 8, showing substrate 80, masked by patterned masking layer 81, with deposited material 82 filling in the "windows" in the mask, and deposited material 83 overlying the mask. After removal of the masking layer, e.g., by a conventional lift-off technique, the situation is as depicted schematically in FIG. 9, with patterned deposited multiconstituent material 82 on substrate 80.

The above-described technique is not the only possible one, and modifications thereof as well as different techniques are readily apparent. For instance, it is possible to form a patterned deposit according to the invention by means of shadow masking of the substrate, i.e., by interposing a mask, consisting of regions capable of preventing passage of the particles in the streams (or of their reaction products) and of regions permitting such passage, between the stream sources and the substrate, generally in close proximity to the substrate.

Figure 10:
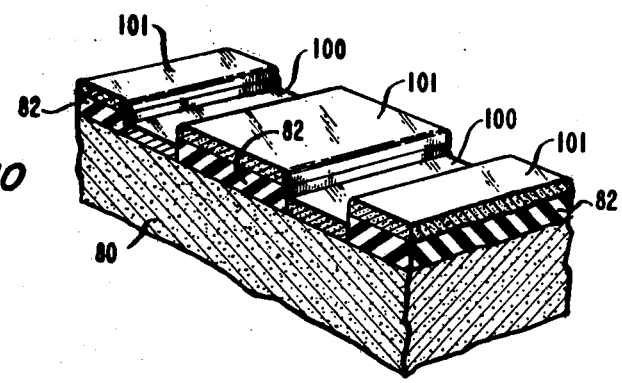
FIG. 10 schematically shows a further layer of material, e.g., a semiconductor, deposited onto the above combination.
Figure 11:
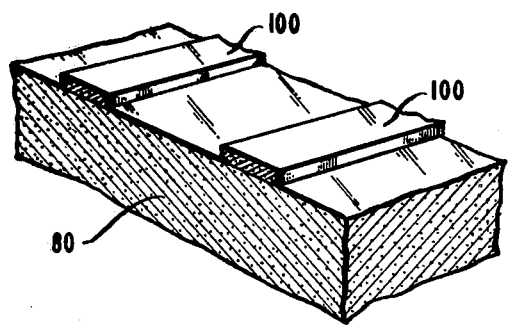
FIG. 11 depicts the above substrate with patterned semiconductor material thereon.

After creation of a patterned layer of multiconstituent material, e.g., a $SiO_2$ layer, on a substrate the patterned layer can, for instance, serve as a mask for the formation of a patterned layer of other material, e.g., epitaxial crystalline material. For instance, it may be possible to form integrated electronic circuits and/or integrated optics devices in III-V materials, e.g., GaAs or InP, by processes comprising depositing an appropriately patterned layer of $SiO_2$ or $Si_3N_4$ on a single crystal III-V substrate, and growing in the windows epitaxial III-V material by conventional techniques (e.g., by MBE). This is schematically depicted in FIG. 10, which shows substrate 80, with overlying patterned multiconstituent layer 82, and deposited thereon a further layer of material, which can form epitaxial crystalline material 100 in the window regions, but which is substantially amorphous material (101) atop the mask. If desired, unwanted material can then be removed by, e.g., lift-off techniques. The result is illustrated in FIG. 11, which shows substrate 80 with patterned crystalline material 100 thereon.

Although the discussion herein has been in terms of a single layer of deposit, the invention is not so limited. The inventive method can, for instance, be used to deposit layered material by means of pulsed particle streams. Pulsing can, for instance, be achieved by means of shutters or through pulsed gas injection into the plasma generator. Attainment of optimally sharp interfaces in layered material may require attention to excited particle lifetime, namely, choice of excited state and/or apparatus lay-out such that particle time of flight to the substrate is substantially equal to particle lifetime. For instance, the oxygen triplet state has a relatively long lifetime, and thus might not be very advantageous for pulsed beam deposition.

EXAMPLE 1

A 900 Å thick film of $SiO_2$ was deposited onto a low temperature (about 100° C.) Si substrate in apparatus of the general type shown in FIG. 2. The single crystal Si wafer substrate was mounted on the sample holder in the deposition system in which the background pressure was generally about $3 \cdot 10^{-6}$ Torr. An oxygen plasma was formed in the plasma generator by a pair of RF electrodes, operating at 300 watts RF power at 30 MHz in an oxygen pressure of about $10^{-4}$ Torr. The plasma was confined by an axial magnetic field (about 200 gauss). A screen (mesh size $\leq 0.3$ mm) was used to preferentially intercept charged particles. Atomic Si was produced by electron beam evaporation (3 KeV) of silicon in an evaporation source. The source was about one mean free path from the substrate. The electron beam was swept by modulating the confining magnetic field of the plasma at a frequency of 0.5 Hz. The oxygen flux was kept essentially constant and the Si flux was controlled by adjusting the e-beam current, such that the atomic oxygen emission line at $\lambda = 7771.94$ Å was of small but nonzero intensity. The line was monitored by means of a Yarrell-Ash Model 82-020 optical spectrometer and a RCA 4840 phototube, using a chopper and a lock-in amplifier (PAR-121). The rate of deposition and the optical quality of the deposit were monitored in situ by a scanning ellipsometer. The deposition rate was about 15 Å/min. The resulting film had essentially the same optical properties in the visible and IR as thermally grown $SiO_2$, had an extremely sharp interface with the substrate (indicating absence of oxidation or other chemical reaction of the substrate during deposition), was free of elemental Si or contaminants within the detection limit of the AES system used, had a dielectric strength of about $5 \cdot 10^6$ V/cm, and C/V characteristics similar to those shown in FIG. 5.

EXAMPLE 2

$Si_3N_4$ was deposited onto a Si substrate by a procedure substantially as described in Example 1, with the exception that $NH_3$ gas instead of $O_2$ was fed into the plasma chamber.

EXAMPLE 3

A 1000 Å thick film of $Al_2O_3$ was deposited onto a single crystal InP substrate in the apparatus referred to, and under conditions similar to those described, in Example 1. The substrate was at about 100° C., the Al beam was produced in the e-beam evaporator, and the deposition rate was about 60 Å/min. The reaction was monitored by observation of 7771.94 Å radiation.

EXAMPLE 4

A $SiO_2$ film was deposited onto Si, and an $Al_2O_3$ film onto InP, under conditions similar to those described in Examples 1 and 3, respectively. The plasma generator was a quartz tube aimed directly at the substrate, with an RF coil around the tube. Pressure inside the tube was about $10^{-1}$ Torr, the oxygen stream issued from a single pinhole ($\sim$3 mm diameter) in the tube. This arrangement permitted maintenance of a pressure of about $10^{-4}$ Torr in the deposition chamber. A magnetic field of about 200 gauss was oriented perpendicular to the plasma tube and served to produce a substantially charged-particle-free oxygen stream. The CV characteristics of the $SiO_2$ film were substantially like those shown in FIG. 6.

EXAMPLE 5

Cl-doped $SiO_2$ is deposited on a Si substrate by a procedure substantially as described in Example 4, with a second plasma tube for producing atomic chlorine added to the apparatus and the particle stream issuing from the tube's orifice also aimed at the substrate.

EXAMPLE 6

A $SiO_2$ layer is deposited on a GaAs substrate by exposing, in apparatus similar to that referred to in Example 5, and prior to exposing the substrate to the silicon and oxygen fluxes, the substrate briefly to a flux of atomic fluorine, followed immediately by deposition of $SiO_2$ onto the thus prepared GaAs surface, by a procedure as described in Example 1.

EXAMPLE 7

Epitaxial ZnO (11$\bar{2}$0) is grown on a single crystal sapphire (01$\bar{1}$2) substrate by a procedure substantially as described in Example 4, with a substrate temperature above about 200° C., with the Zn stream produced by e-beam evaporation of a high purity zinc pellet, the oxygen stream issuing through the orifice from the plasma tube, and the reaction monitored by observation of 7771.94 Å line radiation.

EXAMPLE 8

Onto a Si substrate was spun by a standard technique a layer of an organic resist, and a masking layer having minimum window dimensions of about 1 $\mu$m created by standard exposure-, development-, and etch procedures. Onto the thus masked substrate was then deposited a 1000 Å thick layer of $SiO_2$, by a procedure substantially as described in Example 4, with the substrate at about 30° C. The resist, and the $SiO_2$ deposited thereon, was then removed by a lift-off technique, similar to the well-known procedures employed in Si LSI manufacture, leaving patterned $SiO_2$ with sharp features and essentially no undercutting, and dimensions closely corresponding to the mask window dimensions.

What is claimed is:

1. Method for producing an article, the article comprising at least at some time during its manufacture a multiconstituent first material overlying a second material substrate, the method comprising
    (a) forming the first material by directly, in a vacuum deposition chamber, concurrently at least a first particle stream and a second particle stream at the substrate, characterized in that:
    (b) the first particle stream comprises excited neutral particles, the excited neutral particle flux being a substantial fraction of the total particle flux of the first particle stream,
    (c) the second particle stream consists essentially of neutral particles capable of undergoing a chemical reaction involving the excited neutral particles, and
    (d) the two particle streams are caused to intersect in a volume of space proximate to the substrate, the "reaction region", whereby first material is formed and deposited on the substrate.

2. Method of claim 1, wherein the substrate is maintained at a temperature less than about 250° C.

3. Method of claim 1, wherein at least one of the particle streams comprises a flux of dopant particles.

4. Method of claim 1, wherein at least one of the particle streams is a substantially elemental particle stream.

5. Method of claim 1, wherein the excited neutral particle flux is at least 10% of the total particle flux of the first particle stream.

6. Method of claim 5 wherein substantially no charged particles are present in the first particle stream upon entering into the reaction region.

7. Method of claim 1, wherein the first particle stream is produced by means comprising plasma generating means.

8. Method of claim 7, wherein the plasma generating means comprise means for directing electromagnetic radiation into a plasma generating region.

9. Method of claim 8, wherein the electromagnetic radiation is laser radiation.

10. Method of claim 7, wherein the plasma generating means comprise means for impressing a time varying electrical potential across a plasma generating region.

11. Method of claim 1, wherein the second particle stream is produced by means comprising evaporating means.

12. Method of claim 1, wherein at least the first particle stream is exposed to a magnetic field, whereby at least a substantial part of the charged particles in the beam are removed therefrom.

13. Method of claim 12, wherein the magnetic field direction is substantially parallel to the first particle stream direction.

14. Method of claim 12, wherein the magnetic field direction is substantially perpendicular to the first particle stream direction.

15. Method of claim 1, wherein the second material substrate is a material selected from the group consisting of silicon, germanium, III–V semiconductors, II–VI semiconductors, metals, and insulators.

16. Method of claim 1, wherein the first elemental particle stream consists essentially of gas particles.

17. Method of claim 16, wherein the gas is a chemical element.

18. Method of claim 17, wherein the element is oxygen, nitrogen, hydrogen, fluorine, chlorine, or bromine.

19. Method of claim 1, wherein the substrate is a single crystal and wherein at least one preselected substrate region is masked, prior to deposition of first material onto the substrate, by means of a patterned layer of masking material overlying the substrate.

20. Method of claim 19, wherein the masking material is an organic resist.

21. Method of claim 19, wherein, after deposition of first material onto the masked substrate, the masking material and the first material deposited thereon are removed from the substrate.

22. Method of claim 21, wherein, after removal of the masking material and the first material deposited thereon from the substrate, further material is deposited onto the partially first-material-covered substrate.

23. Method of claim 22, wherein the further material is deposited such that at least part of the material forms epitaxial material.

24. Method of claim 1, wherein the concentration of at least one species of particles in the volume of space proximate to the substrate is changed at least once during the deposition of first material, thereby forming a deposit comprising at least two layers of material differing in chemical composition from each other.

25. Method of claim 1, wherein the substrate is exposed, prior to deposition thereon first material, to a flux of particles.

26. Method of claim 25, wherein the particle flux comprises hydrogen, fluorine, chlorine, HF, HCl, fluoro carbons or chloro-carbons.

27. Method of claim 1, wherein the pressure in the deposition chamber is less than about $10^{-4}$ Torr.

28. Method of claim 27, wherein the pressure is less than about $10^{-7}$ Torr.

29. Article produced by the method of claim 1.

30. Article of claim 29 comprising integrated electrical devices.

31. Method of claim 1, wherein formation of the first material is monitored by observation of characteristic electromagnetic radiation emitted from the reaction region.

32. Method of claim 31, wherein the intensity of the emitted electromagnetic radiation is compared to a predetermined standard value of intensity, and at least one particle stream is adjusted in response to the result of the comparison.

33. Method for depositing a layer of multiconstituent material on a substrate, the method comprising
(a) directing a multiplicity of particle streams to intersect in a volume of space proximate to the substrate, the "reaction region", at least one of the particle streams comprising excited neutral particles, and at least one further particle stream consisting essentially of neutral particles capable of undergoing a chemical reaction involving the excited neutral particles,
(b) detecting characteristic electromagnetic radiation emitted from the reaction region,
(c) comparing the detected radiation intensity to a predetermined value of intensity, and
(d) adjusting at least one process parameter in response to the result of the comparison.

* * * * *